United States Patent
Fung et al.

(10) Patent No.: US 8,588,014 B1
(45) Date of Patent: Nov. 19, 2013

(54) METHODS FOR MEMORY INTERFACE CALIBRATION

(75) Inventors: Ryan Fung, Mississauga (CA); Valavan Manohararajah, Scarborough (CA)

(73) Assignee: Altera Corporation, San Jose, CA (US)

(*) Notice: Subject to any disclaimer, the term of this patent is extended or adjusted under 35 U.S.C. 154(b) by 119 days.

(21) Appl. No.: 13/149,583

(22) Filed: May 31, 2011

(51) Int. Cl.
*G11C 7/00* (2006.01)

(52) U.S. Cl.
USPC .......................................... 365/194; 365/193

(58) Field of Classification Search
USPC ........................................ 365/189.011–208
See application file for complete search history.

(56) References Cited

U.S. PATENT DOCUMENTS

| | | | |
|---|---|---|---|
| 7,475,315 B1 | 1/2009 | Natarajan et al. | |
| 2005/0047192 A1* | 3/2005 | Matsui et al. | 365/145 |
| 2007/0239379 A1 | 10/2007 | Newcomb et al. | |
| 2008/0201597 A1* | 8/2008 | Chong et al. | 713/401 |
| 2008/0276112 A1* | 11/2008 | Matsui et al. | 713/401 |
| 2008/0291758 A1* | 11/2008 | Chu et al. | 365/194 |
| 2009/0031091 A1 | 1/2009 | Chang et al. | |
| 2009/0296503 A1* | 12/2009 | Chu et al. | 365/193 |
| 2010/0180143 A1 | 7/2010 | Ware et al. | |
| 2010/0315119 A1 | 12/2010 | Welker et al. | |
| 2012/0106264 A1* | 5/2012 | Chong et al. | 365/189.02 |

OTHER PUBLICATIONS

Burney et al., U.S. Appl. No. 11/488,199, filed Jul. 17, 2005.
Dastidar et al., U.S. Appl. No. 12/463,358, filed May 8, 2009.
Manohararajah et al., U.S. Appl. No. 13/149,562, filed May 31, 2011.

* cited by examiner

*Primary Examiner* — Harry W Byrne
(74) *Attorney, Agent, or Firm* — Treyz Law Group; Jason Tsai

(57) ABSTRACT

Integrated circuits with memory interface circuitry may be provided. Prior to calibration, a number of samples may be determined by computing probability density function curves as a function of timing window edge asymmetry for different degrees of oversampling. During calibration, duty cycle distortion in data strobe signals may be corrected by selectively delaying the data strobe rising or falling edges. A data clock signal that is used for generating data signals may also suffer from duty cycle distortion. The rising and falling edges of the data clock signal may be selectively delayed to correct for duty cycle distortion. The data path through which the data signals are routed may be adjusted to equalize rising and falling transitions to minimize data path duty cycle distortion. Multi-rank calibration may be performed by calibrating to an intersection of successful settings that allow each memory rank to pass memory operation tests.

12 Claims, 15 Drawing Sheets

METHODS FOR MEMORY INTERFACE CALIBRATION

BACKGROUND

Programmable integrated circuits are a type of integrated circuit that can be configured by a user to implement custom logic functions. In a typical scenario, a logic designer uses computer-aided design (CAD) tools to design a custom logic circuit. When the design process is complete, the CAD tools generate configuration data. The configuration data is loaded into a programmable integrated circuit to configure the device to perform desired logic functions.

In a typical system, a programmable integrated circuit, memory devices, and other electronic components are mounted on a printed circuit board. The programmable integrated circuit includes memory interface circuitry that is used to relay data back and forth between the programmable integrated circuit and the memory devices (i.e., the memory interface circuitry is used to read data from and write data into the memory devices). When performing such memory read and write operations, the timing of control and data signals is critical.

Because programmable integrated circuits can be configured in many different ways and are installed on many different types of boards, the lengths of circuit board traces coupling the programmable integrated circuit to the memory devices can vary from one system to another. As a result, it is generally not possible to know in advance exactly how data and clock paths between a programmable integrated circuit and a given memory device will perform. In some systems, the data and clock paths may have one set of timing characteristics, whereas in other systems the data and clock paths may have a different set of timing characteristics.

Mismatch (or skew) between the data and clock paths may result in degraded setup and hold times. In modern high speed memory interface circuitry that use double data rate (DDR) transfers (i.e., a data transmission scheme in which data toggles on both rising and falling edges of the clock), a small amount of skew will result in faulty data transfer during read and write operations.

SUMMARY

Integrated circuits such as programmable integrated circuits having memory interface circuitry are provided. The memory interface circuitry may be used to communicate with off-chip memory devices (sometimes referred to as memory groups) that are mounted on a circuit board. The memory devices and the circuit board to which the memory devices are mounted may collectively be referred to as a memory module. Data and data strobe signals may be conveyed between the memory devices and the memory interface circuitry. The memory interface circuitry may provide system-level control signals (e.g., a reference clock signal, address signal, and command signal) to the memory devices.

The memory interface circuitry may be calibrated following device startup to ensure reliable read and write operations. Memory interface calibration operations often involve determination of valid timing windows surrounding certain control signals (e.g., timing windows associated with data signals (DQ), data strobe signals (DQS), system clock, etc.). The timing windows may have early and trailing edges that vary in time depending on the current operating condition of the integrated circuit. Oversampling techniques may be used to help improve the accuracy when determining the early and trailing window edges.

Probability of failure curves associated with different number of samples may be obtained. A first set of probability density function curves may then be computed by differentiating the probability of failure curves. A second set of probability density function curves that are a function of window edge asymmetry may then be computed. A desired number of samples may then be selected by analyzing the second set of probability density function curves and determining a suitable degree of oversampling based on user-selected tolerance levels and confidence requirement.

In another suitable embodiment of the present invention, calibration techniques that reduce duty cycle distortion (DCD) in DQS, data generation clock signal, and data path may be provided. To reduce DQS duty cycle distortion, DQS may be shifted in time relative to the system clock to determine a positive-edge window surrounding a rising edge of the system clock and a negative-edge window surrounding a falling edge of the system clock. The positive-edge and negative-edge windows may then be aligned to correct for DQS duty cycle distortion. To eliminate DCD (e.g., to reduce or remove DCD) in the DQ generation clock signal, rising/falling delays of the DQ generation clock signal may be individually adjusted until DQ exhibits satisfactory data eye profiles. To reduce DCD in the data path, rising/falling delays in the data path may be separately adjusted until setup and hold times (e.g., margins between the edges of a valid data window and an associated data strobe signal) measured for rising and falling data patterns are equivalent or set as proportionally as desired.

In another suitable embodiment of the present invention, the integrated circuit may communicate with multiple memory ranks, where the memory ranks receive system-level control signals from the memory interface circuitry in parallel. During calibration operations, a range of satisfactory timing settings may be determined independently for each memory rank. The memory interface circuitry may then be calibrated to satisfy all timing settings. For example, a subset of settings may be determined that is satisfactory across all the memory ranks. An optimum setting may then be computed by selecting a timing setting corresponding to an intermediate (median or mean) setting in the subset of settings.

Further features of the present invention, its nature and various advantages will be more apparent from the accompanying drawings and the following detailed description.

DETAILED DESCRIPTION

Embodiments of the present invention relate to integrated circuits that contain memory interface circuitry. The memory interface circuitry may be used to interface with off-chip memory such as random-access memory (RAM). The integrated circuits may be digital signal processors, microprocessors, application specific integrated circuits, or other suitable integrated circuits. With one suitable arrangement, the integrated circuits that communicate with memory are programmable integrated circuits such as programmable logic device integrated circuits or other programmable integrated circuits that contain programmable circuitry. The programmable circuitry can be programmed using configuration data. Programmable integrated circuits are typically operated in a diverse set of system environments. As a result, these integrated circuits tend to benefit from adjustable timing capabilities of the memory interface circuitry.

Figure 1:
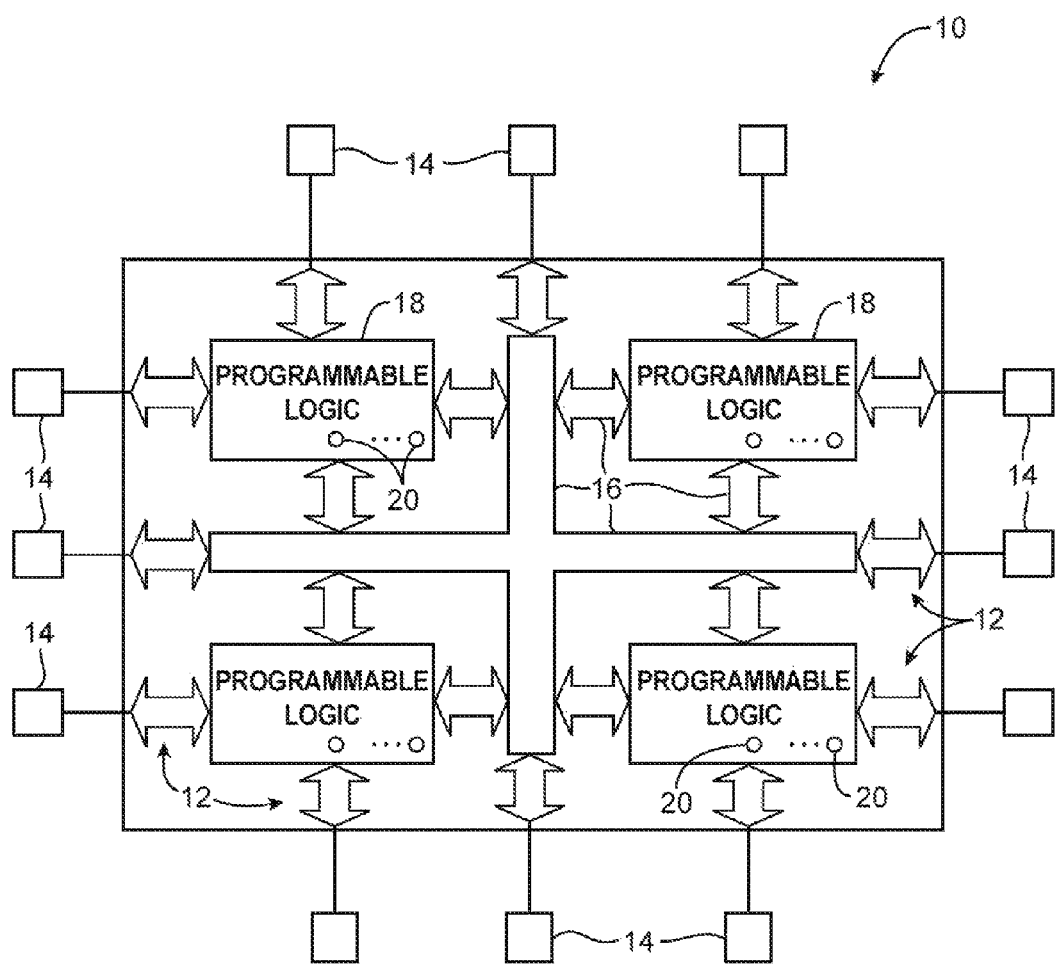
FIG. 1 is a diagram of an illustrative programmable integrated circuit in accordance with an embodiment of the present invention.

FIG. 1 shows a diagram of an illustrative programmable integrated circuit. As shown in FIG. 1, device 10 may have input-output (I/O) circuitry 12 for driving signals off of device 10 and for receiving signals from other devices via input-output pins 14. Interconnection resources 16 such as global and local vertical and horizontal conductive lines and buses may be used to route signals on device 10. Interconnection resources 16 include fixed interconnects (conductive lines) and programmable interconnects (i.e., programmable connections between respective fixed interconnects). Programmable logic 18 may include combinational and sequential logic circuitry. For example, programmable logic 18 may include look-up tables, registers, and multiplexers. The programmable logic 18 may be configured to perform a custom logic function. The programmable interconnects associated with interconnection resources may be considered to be a part of programmable logic 18.

Programmable logic 18 contains programmable elements 20. Programmable elements 20 may be based on any suitable programmable technology, such as fuses, antifuses, electrically-programmable read-only-memory technology, random-access memory cells, mask-programmed elements, etc. As an example, programmable elements 20 may be formed from memory cells. During programming, configuration data is loaded into the memory cells using pins 14 and input-output circuitry 12. The memory cells are typically random-access-memory (RAM) cells. Because the RAM cells are loaded with configuration data, they are sometimes referred to as configuration RAM cells (CRAM).

Programmable element 20 may be used to provide a static control output signal for controlling the state of an associated logic component in programmable logic 18. The output signals generated by elements 20 are typically applied to gates of metal-oxide-semiconductor (MOS) transistors (sometimes referred to as pass gate transistors).

The circuitry of device 10 may be organized using any suitable architecture. As an example, logic 18 of programmable device 10 may be organized in a series of rows and columns of larger programmable logic regions, each of which contains multiple smaller logic regions. The logic resources of device 10 may be interconnected by interconnection resources 16 such as associated vertical and horizontal conductors. These conductors may include global conductive lines that span substantially all of device 10, fractional lines such as half-lines or quarter lines that span part of device 10, staggered lines of a particular length (e.g., sufficient to interconnect several logic areas), smaller local lines, or any other suitable interconnection resource arrangement. If desired, the logic of device 10 may be arranged in more levels or layers in which multiple large regions are interconnected to form still larger portions of logic. Other device arrangements may use logic that is not arranged in rows and columns.

Figure 2:
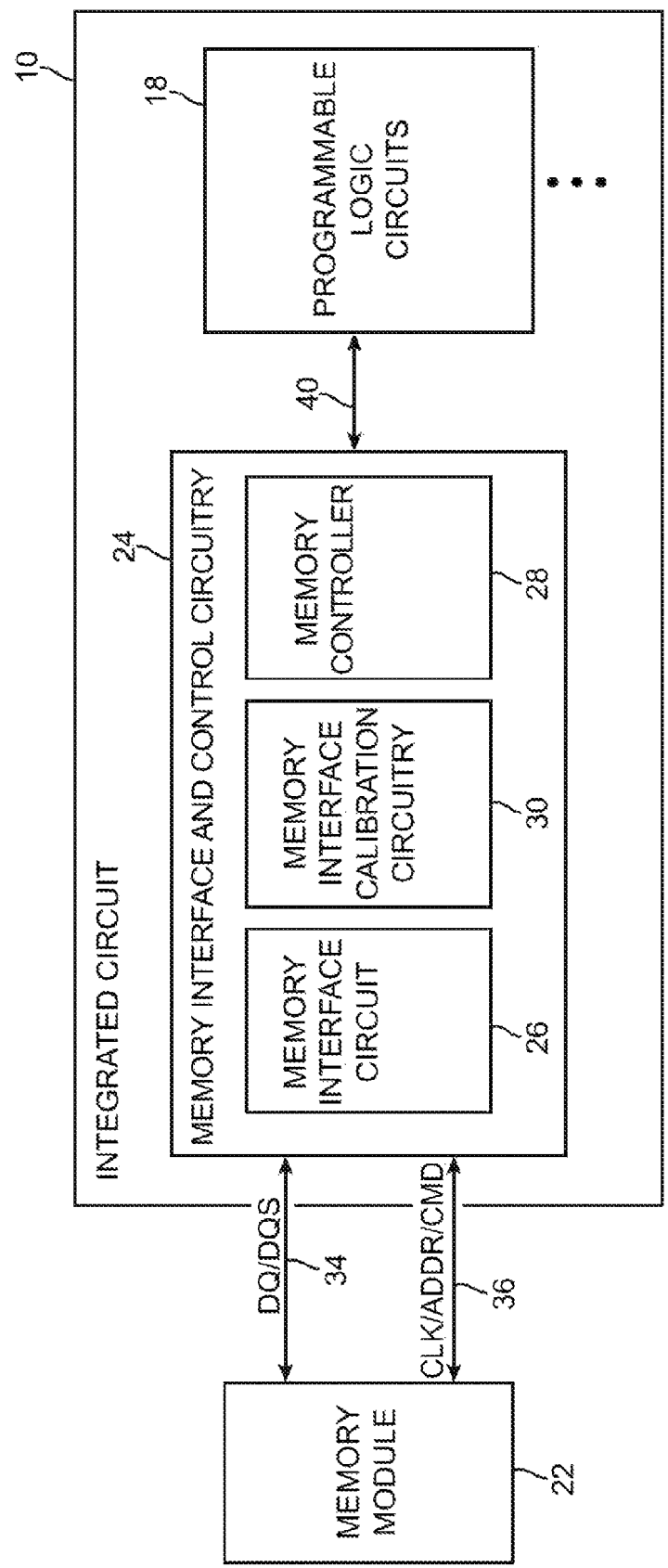
FIG. 2 is a diagram of illustrative memory interface circuitry in accordance with an embodiment of the present invention.

Device 10 may communicate with off-chip memory such as memory module 22. Memory module 22 may be a memory device sometimes referred to as a single in-line memory module (SIMM) or a dual in-line memory module (DIMM). Device 10 may be configured to communicate with at least two memory modules 22, at least four memory modules 22, etc. As shown in FIG. 2, device 10 may include memory interface circuitry 24 (sometimes referred to as memory interface and control circuitry) that serves to relay information between memory module 22 and logic circuits 18 that are internal to device 10. Memory interface circuitry 24 may include memory interface circuit 26, memory controller 28, memory interface calibration circuitry 30, and other peripheral circuitry such as memory access sequencer circuitry (not shown).

Memory interface circuit 26 may be coupled to memory module 22 through paths 34 and 36. During memory read operations, data (DQ) signals and data strobe (DQS) signals may be conveyed from memory module 22 to memory interface circuit 26 over path 34. During memory write operations, DQ/DQS may be conveyed from memory interface circuit 26 to memory module 22 over path 34.

During read and write operations, control signals such as clock CLK, address ADDR, and command CMD signals may be conveyed from memory controller 28 to memory module 22 over path 36. Signal CLK may serve as a system reference clock (e.g., a reference clock to which the DQS signals, address signal ADDR, and command signal CMD should be aligned). Signal CMD may be configured to a first value to initiate a read operation, to a second value to initiate a write operation, to a third value during normal operation, and to other values to initiate any desired operations. Signal ADDR specifies the address (e.g., a selected bank address in a memory device) from which data is read out during read operations and the address to which data is written during write operations.

Memory interface circuit 26 may serve to perform desired data rate conversions and to generate signals that meet timing requirements specified by the memory protocol currently under use. During memory interface calibration processes, memory interface circuitry 24 may be controlled using memory interface calibration circuitry 30 (e.g., to delay relevant signals, to measure read/write margins, to correct for rise/fall skew, etc.). Memory interface calibration circuitry 30 may serve to calibrate memory interface and control circuitry 24 at device startup. During normal operation, memory controller 28 and memory interface circuit 26 may directly communicate with memory 22 while memory interface calibration circuitry 30 remains idle.

Read/write data may be conveyed between memory interface circuitry 24 and programmable circuitry 18 via path 40. Memory controller 28 may be configured to generate appropriate control signals corresponding to the memory protocol currently under use (e.g., circuit 28 may handle memory data management to address desired banks, rows, and columns and to perform memory refresh). Memory controller 28 may also serve to periodically request recalibration of memory interface circuit 26.

The arrangement of FIG. 2 is merely illustrative and is not intended to limit the scope of the present invention. Integrated circuits other than programmable integrated circuits may similarly include memory interface circuitry 24 that is used to communicate with one or more memory modules 22.

Figure 3:
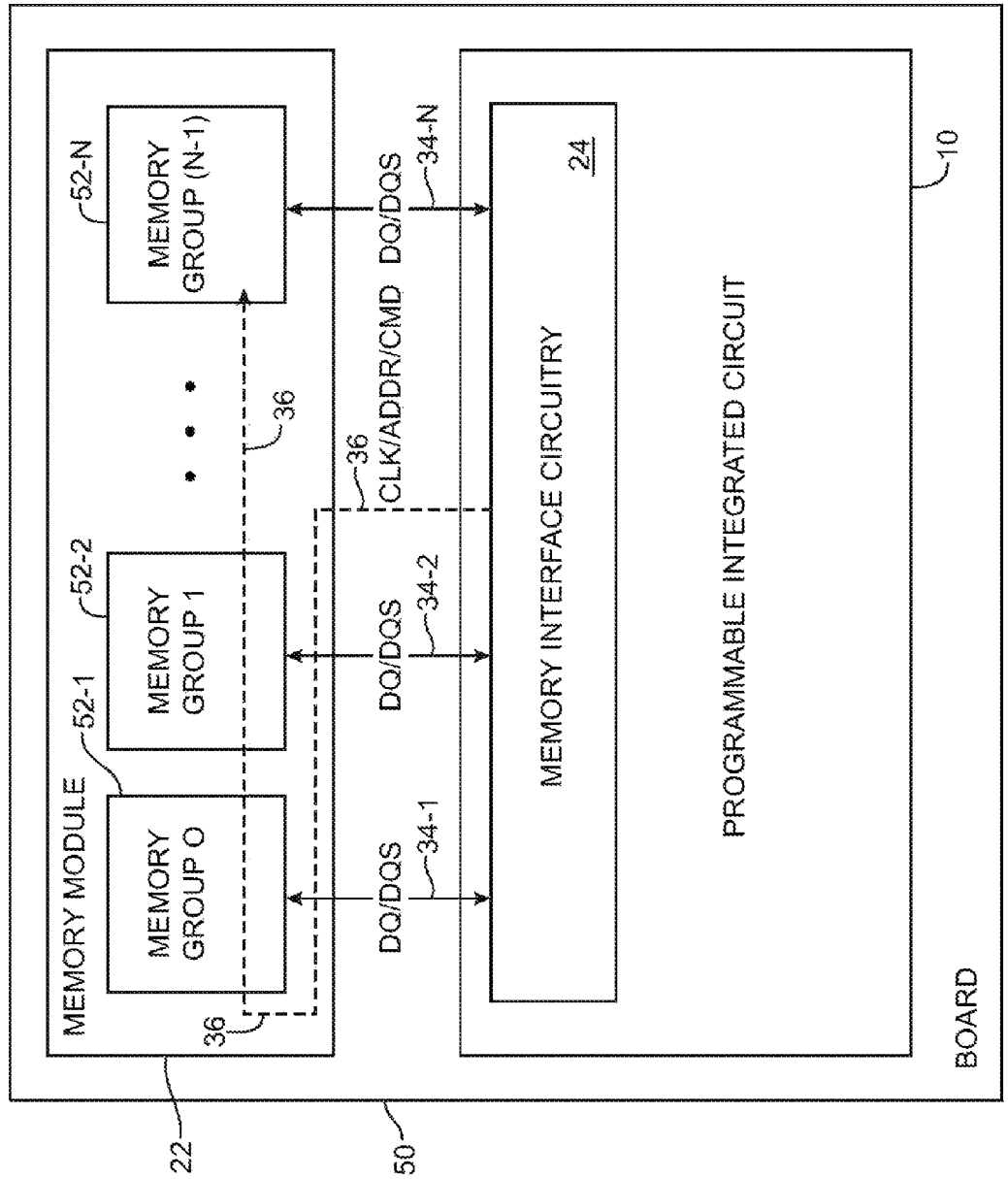
FIG. 3 is a diagram of illustrative memory interface circuitry operating in write leveling in accordance with an embodiment of the present invention.

FIG. 3 is a diagram of illustrative memory interface circuitry operating in write leveling mode. As shown in FIG. 3, integrated circuit 10, memory module 22, and other circuit components (e.g., integrated circuit chips, surface mount components, etc.) may be mounted on a circuit board (e.g., printed circuit board 50). Board components may be interconnected by conductive traces and packaging (e.g., sockets into which integrated circuits are mounted) formed on board 50.

Memory module 22 may include a series of memory devices, at least some of which is sometimes referred to as a memory group. For example, memory module 22 may include first memory group 52-1, second memory group 52-2, . . . , and $N^{th}$ memory group 52-N. Memory module 22 may include at least nine memory groups (as an example). Each of the memory groups may contain hundreds or thousands of memory cells (e.g., RAM cells). The memory groups may communicate with memory interface circuitry through respective signal paths. For example, first memory group 52-1 may communicate with circuitry 24 by sending data and data strobe signals (DQ/DQS) over path 34-1, second memory group 52-2 may communicate circuitry 24 by sending DQ/DQS over path 34-2, etc.

In general, memory access operations are not synchronized with system-level control signals CLK/CMD/ADDR timed at memory interface 26 in device 10. As a result, the DQ signals that are received from the memory groups are not phase aligned with any known clock signal in device 10. It is therefore necessary to provide DQS clock signals with the DQ signals, so that the DQS clocks can be used to synchronize and process the DQ signals. For example, during a read operation, memory interface circuitry 24 uses the DQS clocks in capturing data as it is transmitted over paths 34 from memory 22 (see, e.g., FIG. 2). In general, the operation of each memory group is somewhat independent, so memory module 22 generates a DQS signal for each of the memory groups.

The DQS signals for the different memory groups are generally not phase aligned with each other (e.g., skew may be present among the DQS signals). For example, although the DQS signal for a first memory group is edge-aligned with the DQ signals in the first memory group, the DQS signal for the first memory group and the seventh memory group (as an example) need not be in phase with each other.

Memory interface circuitry 24 may send control signals to the memory groups through path 36. Memory module 22 of FIG. 3 may be a type of memory module that exhibits inherent non-zero layout skew (e.g., the control signals on path 36 may arrive at each of the memory groups at different times). For example, because of the way path 36 is routed, the control signals on path 36 may arrive first at memory group 52-1 and then arrive at each subsequent memory group after some delay.

During read operations, appropriate control signals may be sent over path 36 to direct the memory groups to output read data. Read data may be generated from the memory groups at different times depending on when control signals CLK/CMD/ADDR arrive at a particular memory group. For example, memory group 52-1 may output read data before subsequent memory group 52-2, memory group 52-2 may output read data before subsequent memory group 52-3, memory group 52-3 may output read data before subsequent memory group 52-4, etc. Memory interface circuitry 24 may therefore receive read data from the different memory groups at staggered times. Memory interface circuitry 24 may include calibration and re-synchronization circuitry that can be used to compensate for the skew among the different memory groups.

During write operations, care needs to be taken when sending the DQ/DQS signals to the respective memory groups. Device 10 may, for example, operate in a write leveling mode in which the DQ/DQS signals are sent to the respective memory groups at predetermined staggered time intervals. For example, DQ/DQS may be sent over path 34-1 to memory group 52-1 at a first point in time, whereas DQ/DQS may be sent over path 34-2 to subsequent memory group 52-2 at a second point in time that is later than the first point in time (e.g., DQ/DQS for each subsequent memory group may be sent after some adjustable amount of delay). Sending DQ/DQS from memory interface circuitry 24 to the memory groups using this write leveling approach ensures that the DQ/DQS signals and the control signals arrive synchronized (e.g., that the DQ/DQS signals and the CLK signal are phase aligned).

At device startup, memory interface circuitry 24 may not yet be calibrated properly to communicate with memory module 22 and may therefore result in unreliable reads and writes. In general, a series of read and write calibration operations needs to be performed at device startup to ensure that critical timing constraints are met to satisfy design criteria.

A number of calibration operations involves computing an optimum timing setting based on observation of two timing window edges (e.g., computing an optimum delay setting that centers some control signal within a timing window of interest). For example, it may be desirable to center DQS within each valid DQ window, to center DQS within a working range surrounding a corresponding rising edge of the system clock signal (i.e., to align DQS with respect to the system clock signal for write leveling), to center a DQS enable signal edge within a working range with respect to DQS, etc.

Figure 4:
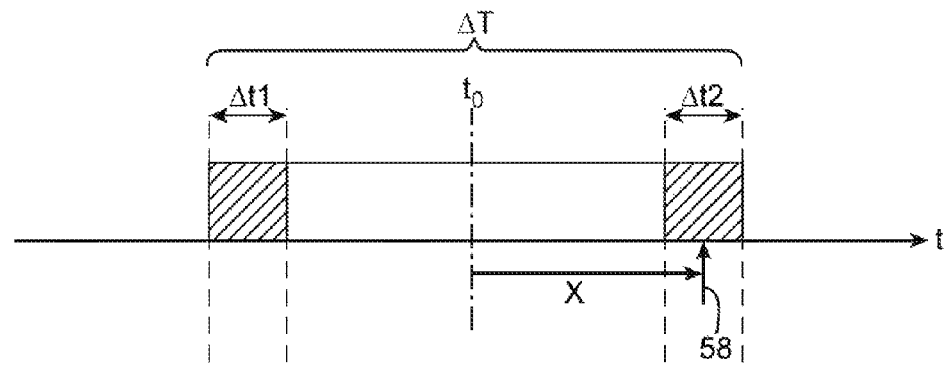
FIG. 4 is an exemplary diagram illustrating variations at the edges of a representative timing window under calibration in accordance with an embodiment of the present invention.

FIG. 4 is an exemplary diagram illustrating variations at the edges of a representative timing window under calibration. For example, a timing window having a center referenced at $t_0$ is shown in FIG. 4. As shown in FIG. 4, timing window $\Delta T$ may exhibit variations in the location of its left and right edges (sometimes referred to as early and late edges, respectively), as indicated by shaded regions $\Delta t1$ and $\Delta t2$. These variations may be the result of process, voltage, and temperature variations (i.e., PVT variations), parasitic signal coupling, or other sources of noise.

When determining the location of the left and right edges, data may be sampled at different points in time with respect to center reference $t_0$. Sampling data within the left and right edges of window $\Delta T$ may produce results indicative of successful read/write operations, whereas sampling data outside of the left and right edges of window $\Delta T$ may produce results indicative of failed read/write operations. The transition between successful sampling events and failed sampling events provides an approximate location of a window edge.

Figure 5:
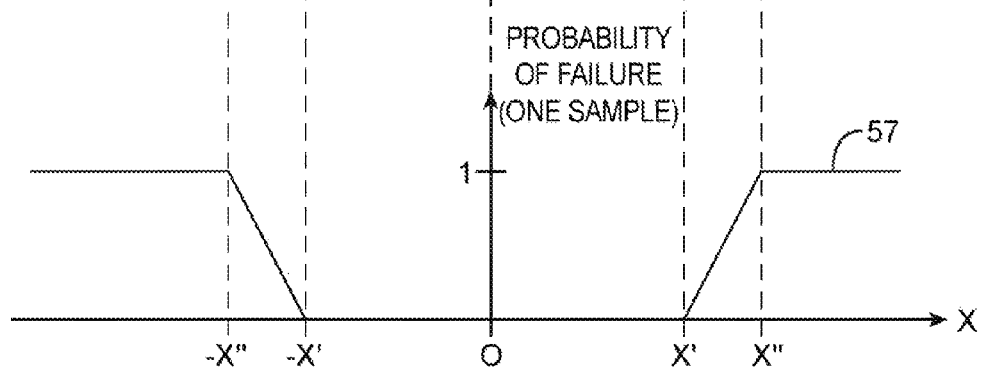
FIG. 5 is an exemplary diagram showing a uniform distribution for a single sampling event failure in accordance with an embodiment of the present invention.

As an example, a single data point 58 may be sample in region of variation $\Delta t2$ (see, e.g., FIG. 4). The difference in position between sampling point 58 and the center of window $\Delta T$ may be defined herein as offset x. FIG. 5 is an exemplary diagram showing a uniform distribution for a single sampling event failure as a function of x. As shown in FIG. 5, the left edge may vary within range $-x''$ and $-x'$, whereas the right edge may vary within range $x'$ and $x''$. The probability of failure may be equal to zero if data is sampled within $|x'|$ of $t_0$ (i.e., all samples succeed near the center of the timing window) and may be equal to one if data is sampled beyond $|x''|$ of $t_0$ (i.e., the probably of sampling a failure is equal to one at or beyond the absolute edge of the timing window).

The probability of failure may be between zero and one when sampling within regions of variation $\Delta t1$ and $\Delta t2$. In general, the probability of failure is greater near the absolute edges of the timing window. The uniform distribution profile 57 of FIG. 5 is merely illustrative and is not intended to limit the scope of the present invention.

In practice, the distribution may be non-uniform and asymmetric (e.g., the left and right edges may vary by different amounts). As an example, if the computed left and right edges are equidistant from the actual center of the timing window, the computed center of the timing window may be accurately determined (i.e., the computed center may be approximately equal to the actual timing window center). If the computed left and right edges are not equidistant from the actual center of the timing window, the computed center of the timing may be erroneously determined (i.e., the computed center may be offset from the actual timing window center). To counteract the variations and asymmetry in the left and right edges of the timing window, oversampling may be used to help determine the timing window center with improved accuracy. The degree of oversampling may be based on user-defined criteria.

Figure 6:
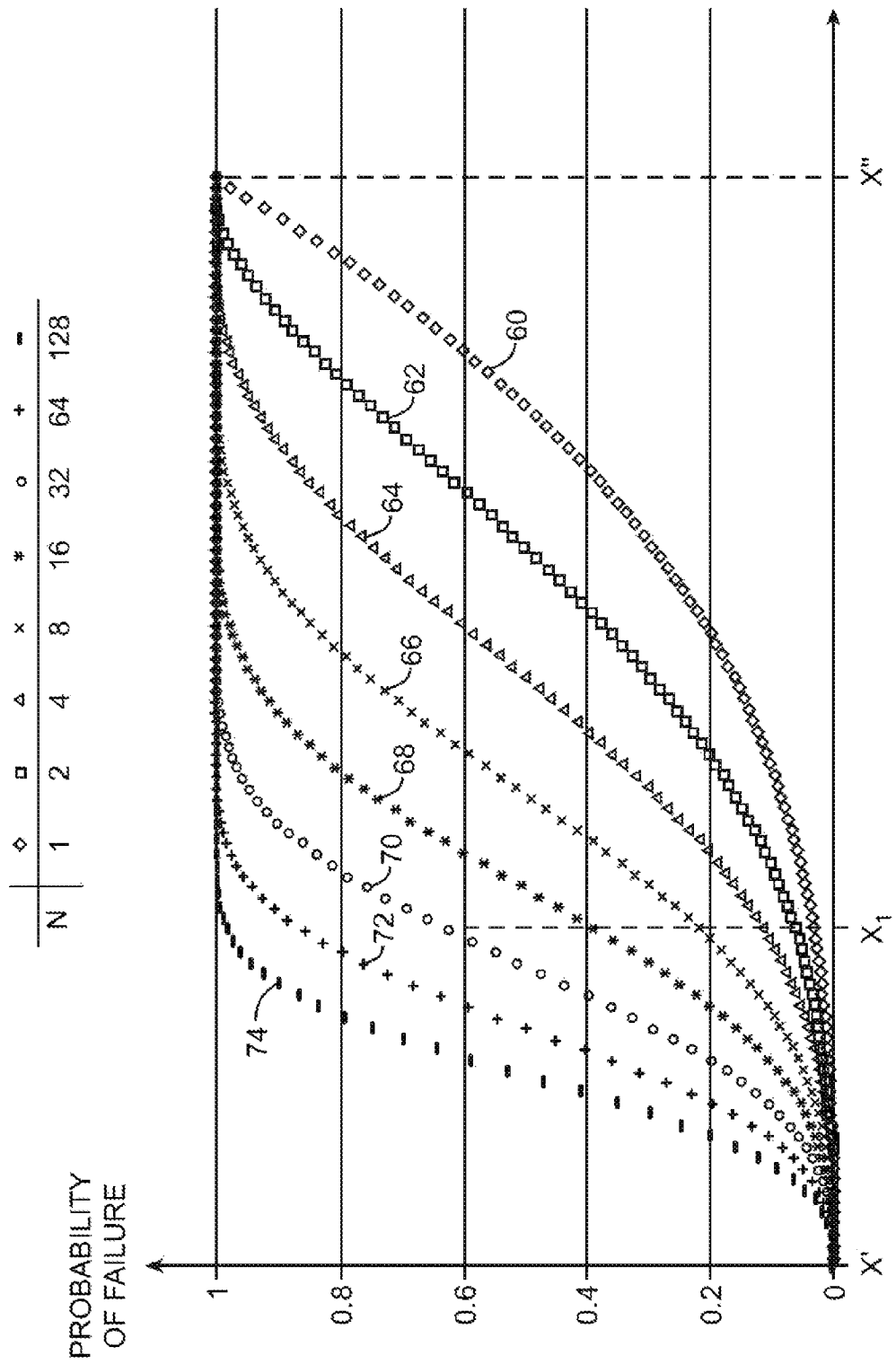
FIG. 6 plots illustrative cumulative distribution function curves associated with sampling a failure for different oversampling in accordance with an embodiment of the present invention.

FIG. 6 plots the probability of failure for different amounts of oversampling. Curve 60 may, for example, characterize the single sample probability of failure for one edge of the timing window, given that data is sampled at position x. The single sample probability of failure may be represented by the expression P(N=1, x). Curves 62, 64, 66, 68, 70, 72, and 74 may characterize the probability of failure associated with an oversampling factor (N) of two, four, eight, 16, 32, 64, and 128, respectively. These curves may be computed as a function of the number of samples N according to equation 1.

$$P(N>1,x)=1-(1-P(N=1,x))^N \quad (1)$$

As shown in equation 1, P(N>1,x) may be a function of the single sample probability of failure P(N=1,x) and N. For example, curve 72 may be computed using equation 2.

$$P(64,x)=1-(1-P(N=1,x))^{64} \quad (2)$$

The number of samples need not be limited to two four, eight, 16, 32, 64, and 128. If desired, any other number of samples may be used during timing window calibration procedures.

As shown in FIG. 6, the probability of observing a failure closer to the center of the timing window increases as N increases (i.e., the probability of sampling a failure closer to x' increases as N is increased). For example, if samples are to be taken at position x1, oversampling with 32 samples may yield a 60% chance of observing a failure (see curve 70), whereas oversampling with eight samples may only yield a 20% chance of observing a failure (see curve 66). Oversampling may therefore allow the user to locate a window edge closer to the center of the timing window, at the cost of the time required to perform the oversampling at each position x (i.e., a tradeoff may exist between increased accuracy and test time). It may therefore be desirable to be able to determine the minimum number of samples N (minimum test time) required to obtain satisfactory results.

Figure 7:
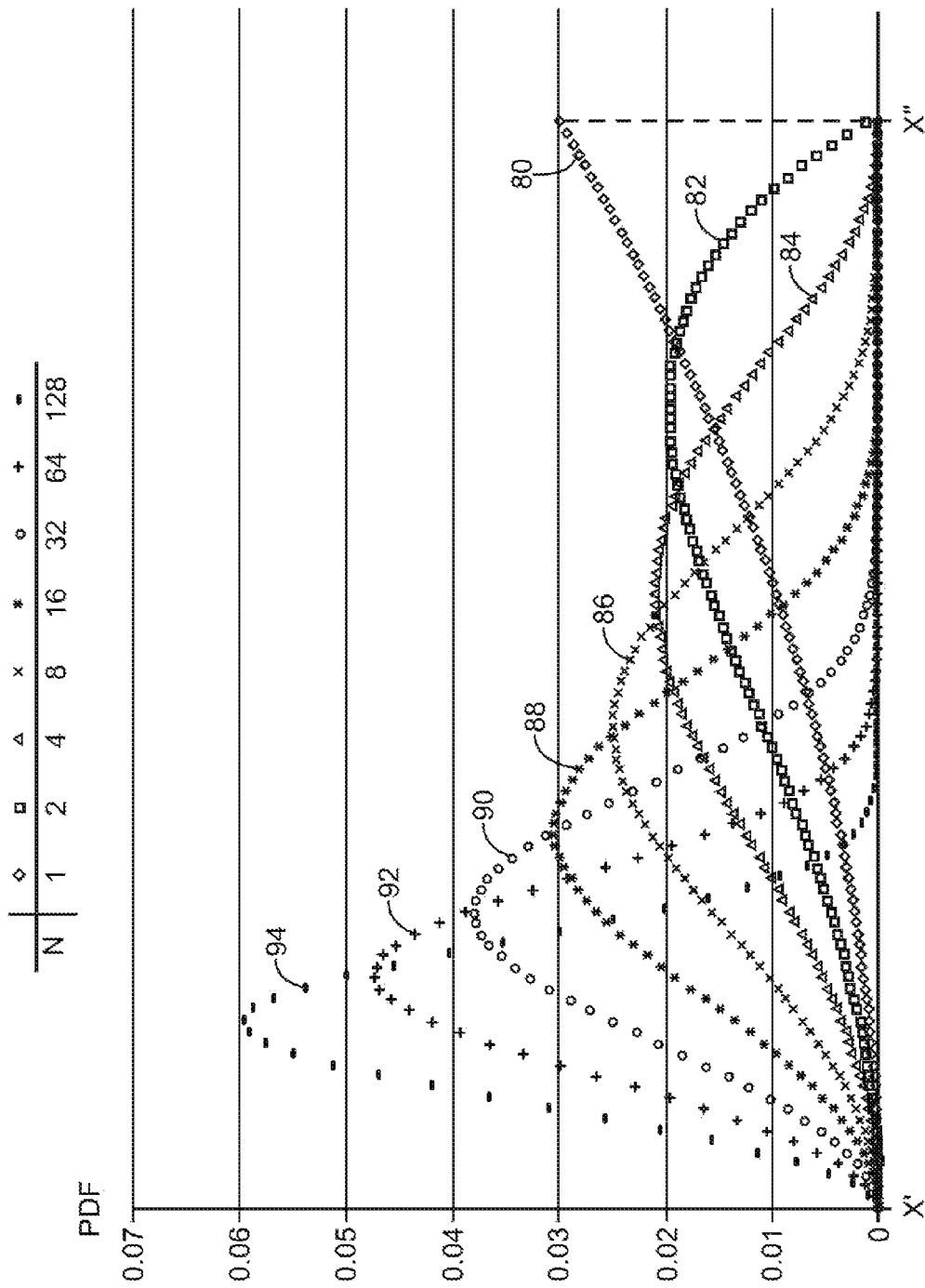
FIG. 7 plots illustrative probability distribution function curves associated with the cumulative distribution function curves of FIG. 6 in accordance with an embodiment of the present invention.

The probability of failure curves of FIG. 6 may be viewed as cumulative distribution function (CDF) curves denoting the position of the observed edge across N samples. The curves of FIG. 6 may be differentiated to obtain probability density function (PDF) curves, as illustrated in FIG. 7. Curves 80, 82, 84, 86, 88, 90, 92, and 94 may represent the PDF characteristic curves associated with an N of one, two, four, eight, 16, 32, 64, and 128, respectively. As shown in FIG. 7, the distribution shifts closer to the center of the timing window (i.e., closer to window edge x') and tightens as N is increased.

Figure 8:
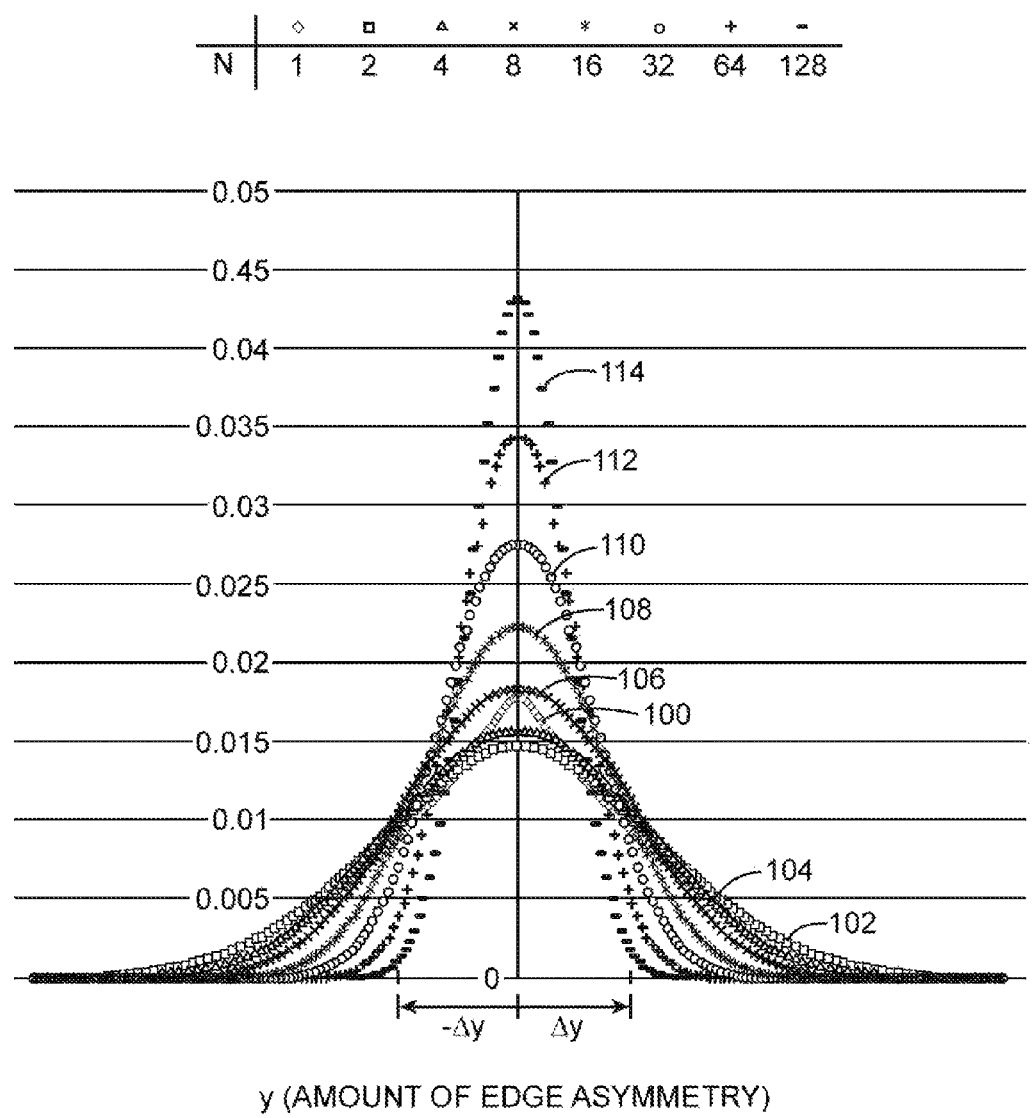
FIG. 8 plots illustrative probability distribution function curves as a function of edge asymmetry in accordance with an embodiment of the present invention.

In a subsequent step, PDF curves characterizing the difference in the relative positions of the left and right edges from the window center can be computed (e.g., PDF curves that are functions of the left and right window edge asymmetry may be determined). FIG. 8 shows the different probability distribution function curves $PDF_{EDGE\_ASYMMETRY}(y, N)$ as a function of the left and right edge asymmetry y and the number of samples N. $PDF_{EDGE\_ASYMMETRY}(y,N)$ may be computed by convolving the PDF curves of FIG. 7 (e.g., taking the integral of the product of the PDF curves in FIG. 7) associated with the left and right window edges, as shown in equation 3.

$$PDF_{EDGE\_ASYMMETRY}(y,N)=\int PDF_{LEFT\_EDGE}(x,N)* PDF_{RIGHT\_EDGE}(x+y,N)dx \quad (3)$$

where $PDF_{LEFT\_EDGE}(x,N)$ represents the probability density function curve associated with the left edge of the timing window and where $PDF_{RIGHT\_EDGE}(x+y,N)$ represents the probability density function curve associated with the right edge of the timing window (taking into account an amount of asymmetry y between the left and right window edges). Curves 100, 102, 104, 106, 108, 110, 112, and 114 may represent the $PDF_{EDGE\_ASYMMETRY}$ characteristic curves associated with an N of one, two, four, eight, 16, 32, 64, and 128, respectively.

The curves of FIG. 8 may be indicative of the likelihood of error between the actual center of the timing window and the computed center of the timing window determined using calibration. Suppose, for example, that memory design criteria can tolerate up to a window edge asymmetry of $\pm\Delta y$. An oversampling factor may be selected that provides a cumulative probability exceeding a user-selected threshold (sometimes referred to as a confidence requirement) when integrating the curve from $-\Delta y$ to $\Delta y$.

For example, consider a scenario in which the user-selected confidence requirement is equal to 60% and the acceptable amount of asymmetry is equal to $\pm\frac{1}{20}$ of the timing window ($\pm T/20$). In this example, curve 106 (N=8) may yield an unsatisfactory 55% confidence level when integrated from position $-T/20$ to $T/20$, whereas curve 108 (N=16) may yield a satisfactory 62% confidence level when integrated from position $-T/20$ to $T/20$. As a result, an oversampling factor of 16 may be selected as the desired amount of oversampling because an N of 16 is the minimum amount of oversampling required to meet the confidence threshold given the user-selected error tolerance.

Figure 9:
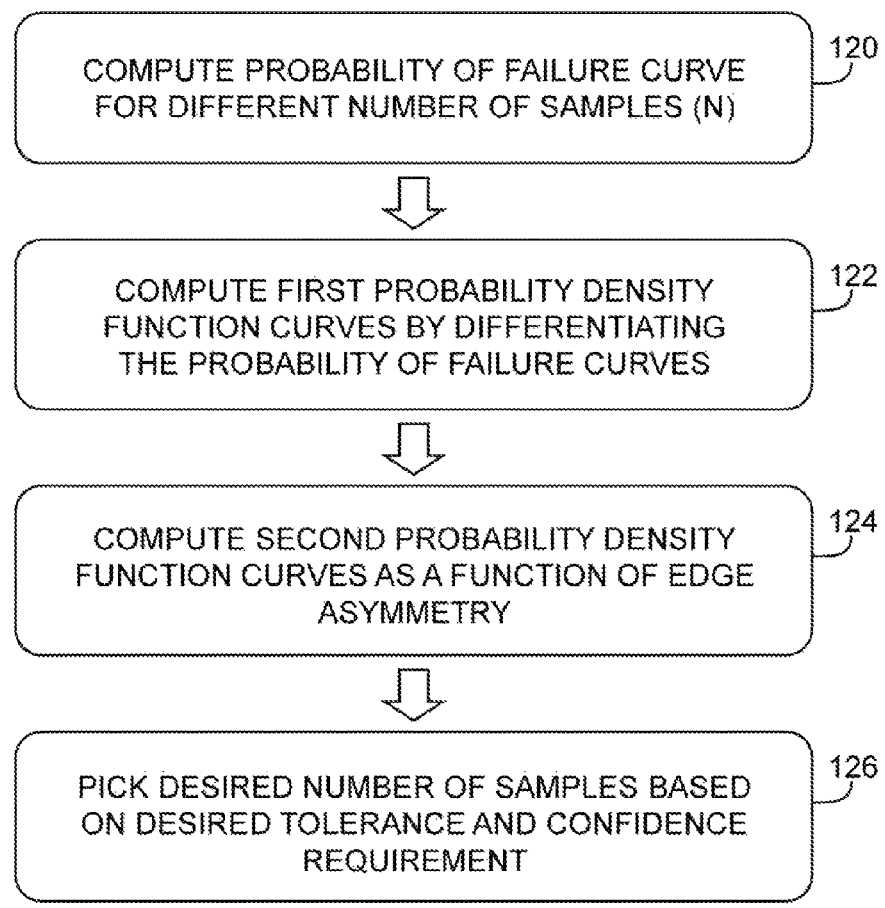
FIG. 9 is a flow chart of illustrative steps involved in determining a desired number of samples in accordance with an embodiment of the present invention.

FIG. 9 is a flow chart of illustrative steps involved in determining the amount of oversampling to be used for memory calibration operations. At step 120, probability of failure curves may be computed for different number of samples N (e.g., to generate the curves of FIG. 6). At step 122, a first set of probability density function curves may be computed by differentiating the probability of failure curves obtained during step 120 (e.g., to generate the curves of FIG. 7).

At step 124, a second set of probability density function curves may be computed using equation 3 (e.g., to generate the curves of FIG. 8). At step 126, a desired number of samples may be determined based on tolerance and confidence levels satisfying design criteria. It is appreciated that the confidence levels may be a default value that is changeable in response to a user input. The steps of FIG. 9 are merely illustrative and are not intended to limit the scope of the present invention.

In general, the number of samples N determined using these steps may be based on the variation of data relative to system clock CLK. Each sample may involve several point measurements using sampling hardware to determine whether an event is considered to be successful or failing. Oversampling factor N may be determined conservatively (i.e., larger Ns are selected) to ensure that the desired tolerance is achieved.

The successive samples may also be taken over timescales that are appropriate for the sources of variation that calibration is attempting to factor out. For example, if voltage variations can only be observed over several hundreds of nanoseconds, it would not make sense to perform the successive samples over a few nanoseconds. The set of samples should be taken over a few microseconds to allow the voltage variations to manifest during calibration (as an example). Different types of variations may have respective timescales. The variation having the longest timescale should be considered when determining the time interval for the set of samples when performing oversampling.

Figure 17:
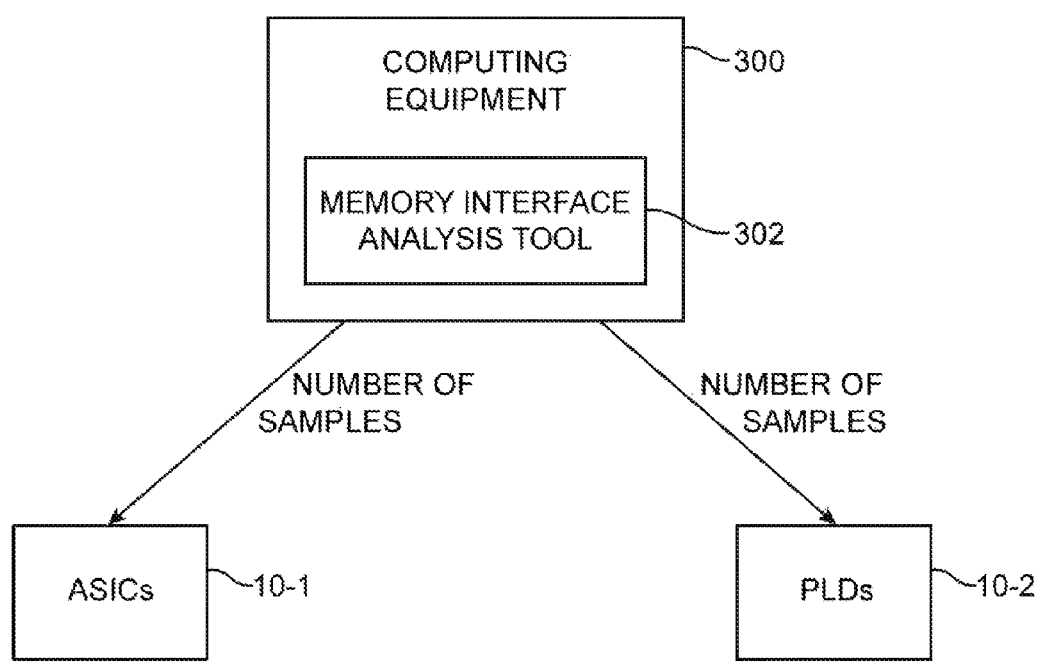
FIG. 17 is a diagram of an illustrative memory interface analysis tool for configuring memory interface circuitry in accordance with an embodiment of the present invention.

The steps of FIG. 9 may be performed using a memory interface analysis tool. As shown in FIG. 17, memory interface analysis tool 302 may be run on computing equipment 300. Memory interface analysis tool 302 may be used to obtain the plots of FIGS. 6-8 using equations 1-3. Computing equipment 300 may be based on any suitable computer or network of computers. With one suitable arrangement, computing equipment 300 includes a computer that has sufficient processing circuitry and storage for memory interface analysis tool 302 and the corresponding analysis results. Equipment 300 may have a display and user input interface for gathering user input and displaying analysis results to a user.

Tool 302 may be used to generate a desired amount of oversampling for memory interface circuitry in application-specific integrated circuits 10-1 and/or programmable logic devices 10-2 (as examples).

The data and data strobe signals conveyed between memory interface circuitry 24 and memory module 22 often suffer from rise/fall skew (e.g., the DQ and DQS signals may experience different rise and fall times). Rise/fall skew can act to alter the duty cycle of DQS and to collapse read/write DQ eyes, both of which have a negative impact on the performance of memory that utilizes double-date-rate (DDR) transfer protocols, triple-date-rate (TDR) transfer protocols, etc. Calibration techniques that can be used to correct for such rise/fall skew is described herein as another embodiment of the present invention.

Duty cycle distortion (DCD) present in data strobe signals may be corrected for during write leveling calibration operations (as an example). Duty cycle distortion in DQS can directly affect write leveling margins associated with both positive (rising) and negative (falling) edges in DQS. During DQS DCD calibration operations, DQ may be held constant if the timing relationship between DQ and DQS has not yet been calibrated (e.g., a constant burst of "1s" or "0s" may be written to memory during DQS DCD calibration).

Figure 10:
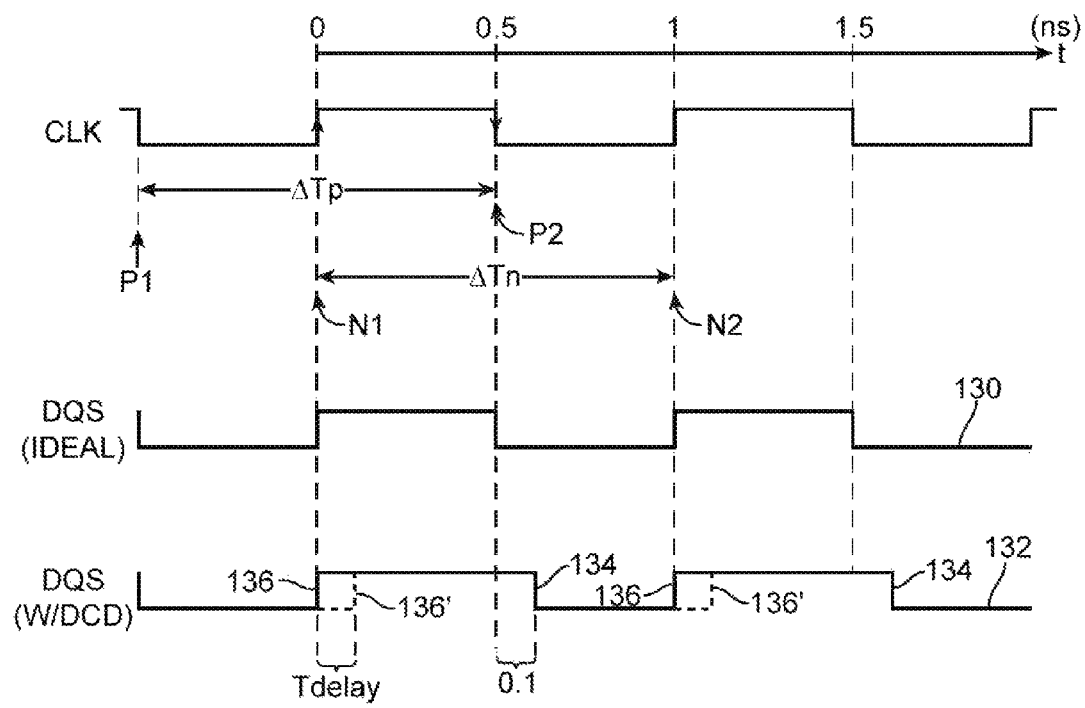
FIG. 10 is an exemplary timing diagram showing duty cycle distortion associated with data strobe signals in accordance with an embodiment of the present invention.

FIG. 10 is an exemplary timing diagram illustrating duty cycle distortion associated with data strobe signals DQS. As shown in FIG. 10, system clock CLK may have a period of 1 ns and a 50% duty cycle. The clock period of 1 ns is merely illustrative. In practice, the clock period may have any suitable value greater than 1 ns or less than 1 ns.

In order to properly load data into memory, DQS should have a rising edge that is aligned within a positive-edge window $\Delta Tp$ centered about a corresponding CLK rising edge. Similarly, DQS should have a falling edge that is aligned within a negative-edge window $\Delta Tn$ centered about a corresponding CLK falling edge. Window $\Delta Tp$ may have an early edge P1 and a trailing edge P2 (sometimes referred to as left and right edges, respectively), whereas window $\Delta Tn$ may have an early edge N1 and a trailing edge N2. Windows $\Delta Tp$ and $\Delta Tn$ may each have, for example, a duration of 1 ns.

An ideal DQS signal may have rising clock edges that coincide with the center of windows $\Delta Tp$ and falling clock edges that coincide with the center of windows $\Delta Tn$, as illustrated by waveform 130 (e.g., the rising/falling clock edges of CLK and DQS are perfectly aligned). At device startup, however, the DQS signal is typically non-ideal and can suffer from duty cycle distortion.

As an example, DQS waveform 132 in FIG. 10 may exhibit weaker falling transitions 134 relative to its rising transitions 136 (i.e., the fall time of DQS 132 is greater than the rise time of DQS 132). In this example, the fall time of DQS 132 is longer by 0.1 ns, resulting in a distorted duty cycle of 60%.

Figure 11:
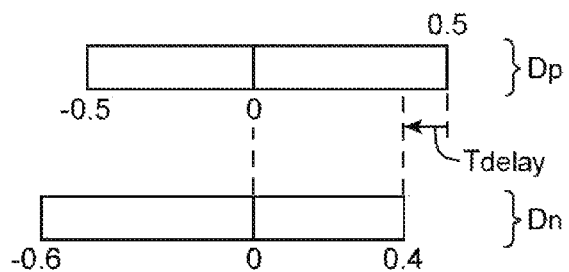
FIG. 11 is an exemplary diagram showing delay settings associated with a positive-edge window and a negative-edge window in accordance with an embodiment of the present invention.

Detection of rise/fall skew may involve delaying the DQS signal by varying amounts to find the early and trailing edges of positive-edge window $\Delta Tp$ and the early and trailing edges of negative-edge window $\Delta Tn$. FIG. 11 is an exemplary diagram showing delay settings associated with a positive-edge window and a negative-edge window (i.e., FIG. 11 shows delay settings Dp that have been applied to DQS signal 132 in determining the early and trailing edges of positive-edge window $\Delta Tp$ and delay settings Dn that have been applied to DQS signal 132 in determining the early and trailing edges of negative-edge window $\Delta Tn$). Dp and Dn correspond to delay settings that may be issued to circuitry operable to delay the rising and falling edges of DQS by the same amount (e.g., the duty cycle of DQS does not change upon applying delay settings, Dp or Dn).

As shown in FIG. 11, DQS can be shifted with respect to CLK to the left by 0.5 ns to locate early edge P1 and to the right by 0.5 ns to locate trailing edge P2 (see, e.g., settings Dp). In this example, DQS can be shifted with respect to CLK to the left by 0.6 ns to locate early edge N1 and to the right by 0.4 ns to locate trailing edge N2 (see, e.g., settings Dn). Settings Dp and Dn may sometimes be referred to as positive-edge and negative-edge delay windows, respectively.

Having misaligned windows Dp and Dn is indicative of rise/fall skew. If the right edge of Dn is shorter than the right edge of Dp, the falling edges of DQS fail first (indicating that DQS falling edges are too late). In such scenarios, the rising edges of DQS may be delayed appropriately to compensate for the skew. If the right edge of Dp is shorter than the right edge of Dn, the rising edges of DQS fail first (indicating that DQS rising edges are too late). In such scenarios, the falling edges of DQS may be delayed appropriately to compensate for the skew. Device 10 may therefore include control circuitry that is operable to separately adjust the delays of the rising and falling edges of DQS when performing DQS duty cycle distortion calibration.

In the example of FIGS. 10 and 11, the right edge of Dn is shorter than the right edge of Dp by 0.1 ns. Rising edges 136 may therefore be independently delayed by 0.1 ns (while fallings edges 134 remain unperturbed) to compensate for the weaker falling edges (e.g., rising edges 136 may be delayed to new position 136' by amount Tdelay, where Tdelay is equal to the 0.1 ns offset between Dp and Dn). Separately adjusting rise/fall delay in this way may serve to calibrate out (i.e., to eliminate) the DCD in the DQS signal.

Figure 12:
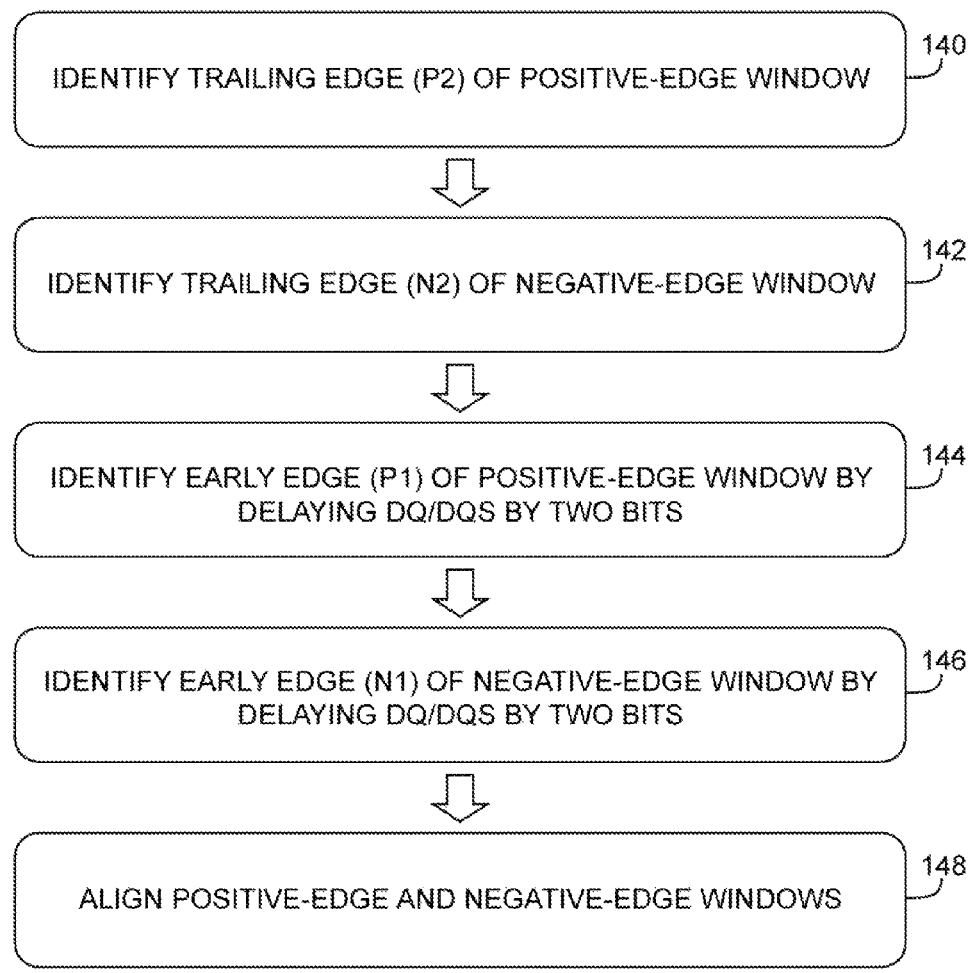
FIG. 12 is a flow chart of illustrative steps for performing data strobe duty cycle distortion correction during write leveling calibration in accordance with an embodiment of the present invention.

FIG. 12 is a flow chart of illustrative steps for performing DQS DCD correction during write leveling calibration. At step 140, trailing edge P2 of positive edge window ΔTp may be identified (to determine the right edge of Dp). This can be done by attempting to overwrite memory 22 with a burst of constant data and by monitoring whether data has been successfully written into memory. For example, consider a first scenario in which memory 22 is originally storing "00000000" at a given memory address. A burst pattern "11111111" may then be written to the given memory address. If rising edge 136 of DQS is within ΔTp, data that is read back from the given memory address will be equal to "1x111111" (X could be "0" or "1" depending on DCD). Delay settings Dp may be adjusted incrementally by delaying DQS with respect to CLK until "0Y111111" is read back from the given memory address (Y could be "0" or "1" depending on DQS DCD). The first setting that causes the first bit to change from a "1" to a "0" is indicative of the position of trailing edge P2. Monitoring the first bit in the bit stream under observation in this way may identify the setting corresponding to the right edge of Dp.

At step 142, trailing edge N2 of negative edge window ΔTn may be identified (to determine the right edge of Dn). Consider a second scenario in which memory 22 is originally storing "00000000" at the given memory address. A burst pattern "11111111" may then be written to the given memory address. If falling edge 134 of DQS is within ΔTn, data that is read back from the given memory address will be equal to "X1111111." Delay settings Dn may be adjusted incrementally by delaying DQS with respect to CLK until "Y0111111" is read back from the given memory address. The first setting that causes the second bit to change from a "1" to a "0" is indicative of the position of trailing edge N2. Monitoring the second bit in the bit stream in this way may identify the setting corresponding to the right edge of Dn.

At step 144, early edge P1 of positive edge window ΔTp may be identified (to determine the left edge of Dp). For example, consider a third scenario in which memory 22 is originally storing "00000000" at the given memory address. A burst pattern "00111111" may then be written to the given memory address (e.g., by delaying DQ/DQS by two bits so that the first valid bit is the third bit). If rising edge 136 of DQS is within ΔTp, data that is read back from the given memory address will be equal to "0X111111." Delay settings Dp may be adjusted incrementally by delaying CLK with respect to DQS until "1Y111111" is read back from the given memory address. The first setting that causes the first bit to change from a "0" to a "1" is indicative of the position of early edge P1. Monitoring the first bit in the bit stream in this way may identify the setting corresponding to the left edge of Dp.

At step 146, early edge N1 of negative edge window ΔTn may be identified (to determine the left edge of Dn). For example, consider a fourth scenario in which memory 22 is originally storing "00000000" at the given memory address. A burst pattern "00111111" may then be written to the given memory address. If falling edge 134 of DQS is within ΔTn, data that is read back from the given memory address will be equal to "X0111111." Delay settings Dn may be adjusted incrementally by delaying CLK with respect to DQS until "Y1111111" is read back from the given memory address. The first setting that causes the second bit to change from a "0" to a "1" is indicative of the position of early edge N1. Monitoring the second bit in the bit stream in this way may identify the setting corresponding to the left edge of Dn.

At step 148, positive-edge delay window Dp and negative-edge delay window Dn may be aligned by independently delaying either the rising edges of DQS or the falling edges of DQS. For example, if the middle of the positive-edge delay window Dp is later in time with respect to the middle of the negative-edge delay window Dn, the rising edges may be independently delayed. If the middle of the negative-edge delay window Dn is later in time with respect to the middle of the positive-edge delay window Dp, the falling edges may be independently delayed. The steps of FIG. 12 may be performed using memory interface calibration circuitry 30 and are merely illustrative. If desired, other techniques of correcting for data strobe DCD during calibration procedures may be used. For example, data strobe DCD can be measured using DQ timing windows are a reference instead of clock timing windows.

Figure 13A:
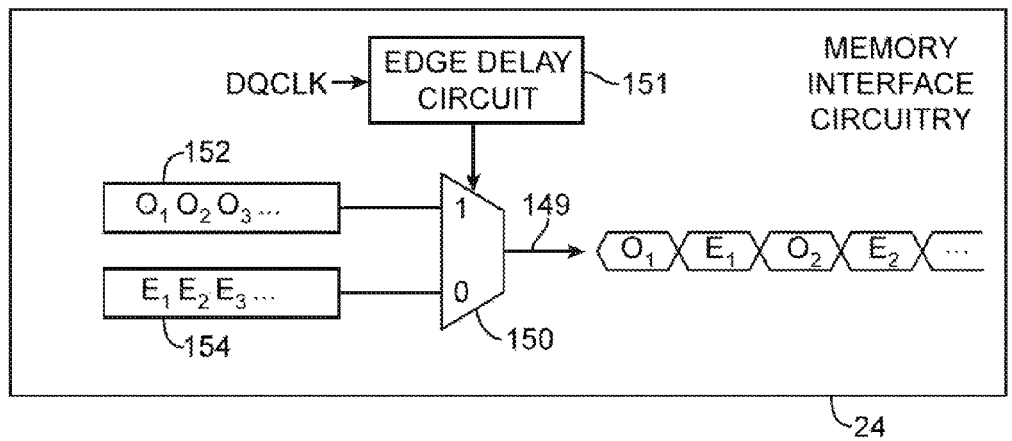
FIG. 13A is an exemplary diagram showing generation of odd and even data bits in accordance with an embodiment of the present invention.

Duty cycle distortion may also be present in clock signals that are used for DQ generation. FIG. 13A is an exemplary diagram showing generation of odd and even data bits using memory interface circuitry 24. As shown in FIG. 13A, device 10 may include a switch circuit 150 having a first input that receives "odd" data bits (e.g., bits $O_1 O_2 O_3 \ldots$ ) from data register 152, a second input that receives "even" data bits (e.g., bits $E_1 E_2 E_3 \ldots$ ) from data register 154, and a control input that receives data generation clock signal DQCLK through edge-delay circuit 151. Switch circuit 150 may, for example, be a multiplexer. Switch circuit 150 may have an output 149 on which DQ is generated. When DQCLK is high, the odd bits may be passed through to output 149. When DQCLK is low, the even bits may be passed through to output 149.

Figure 13B:
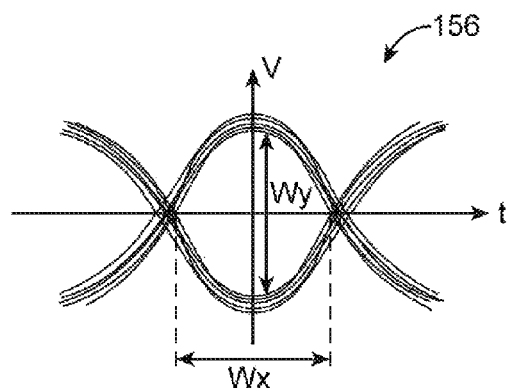
FIG. 13B is an illustrative data eye diagram in accordance with an embodiment of the present invention.

It is generally desirable for DQCLK to exhibit minimal DCD when generating data signals using a configuration of this type. FIG. 13B shows a DQ eye diagram 156. Eye diagram may have an eye opening defined by width Wx and height Wy. Eye diagram 156 may be obtained separately for the odd data bits and the even data bits. If DQCLK suffers from DCD, the eye diagram associated with the odd data bits and the eye diagram associated with the even data bits may be different in size (i.e., one eye opening is wider than the other). These eyes can be observed when sweeping DQ with respect to DQS, or vice versa, when performing DQ versus DQS calibration.

In such scenarios, edge-delay circuit 151 may be configured to independently adjust the rising edge delay or the falling edge delay of DQCLK to correct for DCD. For example, if the odd bit eye diagram has an eye opening wider than that of the even bit eye diagram, edge-delay circuit 151 may be used to delay the rising edges of DQCLK to equalize the size of odd and even bit eye diagrams 156. Edge-delay circuit 151 may, for example, be configured automatically using memory interface calibration circuitry 30 during calibration procedures.

Figure 14A:
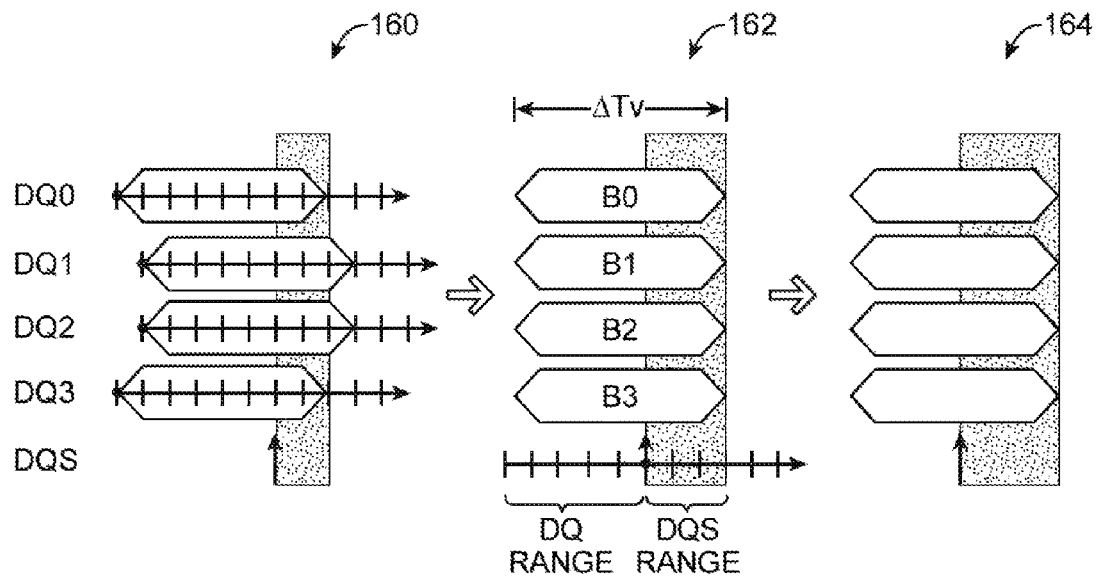
FIG. 14A is a diagram showing illustrative steps for data strobe centering in accordance with an embodiment of the present invention.

FIG. 14A is a diagram showing illustrative steps involved in performing DQ/DQS centering. Data versus data strobe calibration may serve to place the rising edges of DQS at the center of each valid DQ window (i.e., to maximize DQ and DQS setup and hold margins). Diagram 160 shows a first snapshot in time before DQ/DQS centering has been performed. As shown in diagram 160, the DQ signals may be offset in time with respect to one another (e.g., DQ0 and DQ1 are offset by one delay step). Signal DQS is also not placed at the center of each DQ window.

Diagram 162 shows a second snapshot in time after the DQ signals have been equalized. For example, DQ0 and DQ3 may be delayed by one delay step so that DQ0-DQ4 are aligned to a common data valid window ΔTv. During a first time period, the DQ signals may be delayed to determine the DQ range (e.g., to measure a setup time). During a second time period, the DQS signals may be delayed to determine the DQS range (e.g., to measure a hold time). In the example of FIG. 14A, the measured DQ range is equal to five delay steps, whereas the measure DQS range is equal to three delay steps. DQS may be shifted back to its original position (i.e., its position in diagram 160) after determining the DQS range.

Diagram 164 shows a third snapshot in time after DQ/DQS centering has been performed. In this example, each of signals DQ0-DQ3 have been delayed by one additional delay step so that the DQ range and the DQS range are equal (e.g., so that DQS is centered within ΔTv).

Memory interface circuitry 24 may include read capture registers and write launch registers. Data may be captured using the read capture registers during read operations, whereas data may be output using the write launch registers during write operations. If the measured setup times differ between rising and falling data patterns, DCD adjustments can be made to the DQ paths before the read capture registers and after the write launch registers. The same can be done based on hold times.

Figure 14B:
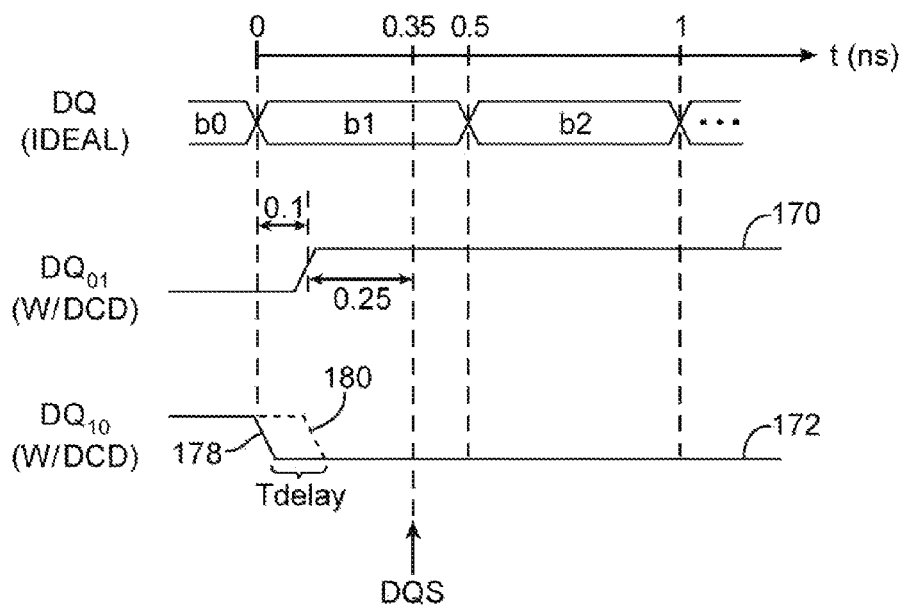
FIG. 14B is an exemplary timing diagram for duty cycle distortion in a data path in accordance with an embodiment of the present invention.

FIG. 14B is an exemplary timing diagram showing DCD in the DQ path. As shown in FIG. 14B, an ideal DQ should toggle every 0.5 ns (as an example). The DQ path may, however, introduce an extra rising delay of 0.1 ns. In this scenario, the DQ range of ΔTv (FIG. 14A) may have different values depending on whether a rising or falling data pattern is being used.

For example, consider the example in FIG. 14B in which DQS is nominally offset by 0.35 ns relative to the ideal rising edge of DQ. If rising data pattern "01" is being calibrated, the DQ range may be equal to 0.25 ns (see waveform 170). If falling data pattern "10" is being calibrated, the DQ range may be equal to 0.35 ns (see waveform 172). This discrepancy may be corrected by independently weakening the falling transitions in the DQ path so that the DQS ranges associated with both rising transitions and falling transitions are equivalent. In this example, weakening the falling transitions may delay falling edge 178 by Tdelay to new position 180. Adjusting the rising and falling transitions in this way may effectively reduce DCD in the DQ paths.

If desired, the DQS DCD calibration operations described in connection with FIG. 12, the DQCLK DCD calibration operations described in connection with FIGS. 13A and 13B, and the DQ path calibration operations described in connection with FIGS. 14A and 14B may be performed and repeated in any suitable order and/or combination.

Figure 15A:
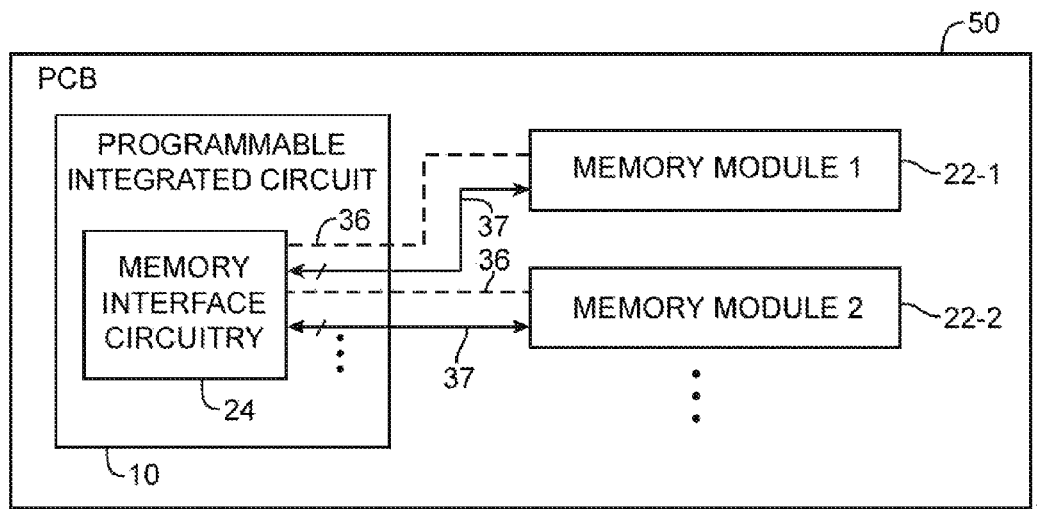
FIG. 15A is a diagram of illustrative memory interface circuitry for communicating with multiple memory ranks in accordance with an embodiment of the present invention.

FIG. 15A is a diagram showing a system in which memory interface circuitry 24 is configured to communicate with multiple memory ranks. As shown in FIG. 15A, device 10 and first and second memory modules 22-1 and 22-2 may be mounted on printed circuit board 50. Each of the memory modules may include at least one memory rank. In other suitable embodiments, only one memory module having at least two memory ranks may be used. Memory interface circuitry 24 may send system control signals (e.g., CLK/ADDR/CMD) to each memory rank via control path 36. Signals DQ/DQS may be conveyed between memory interface circuitry 24 and each memory rank via respective paths 37.

Figure 15B:
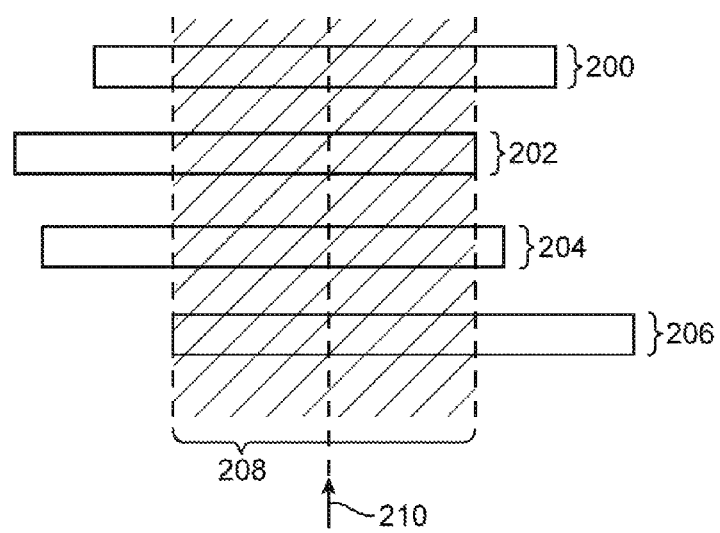
FIG. 15B is an exemplary diagram showing a common range of settings associated with multiple memory ranks in accordance with an embodiment of the present invention.

Each memory rank may be calibrated separately upon device startup. An acceptable range of timing settings may be determined for each rank (e.g., settings that configure memory interface circuitry 24 to successfully pass read/write tests during calibration). FIG. 15B is an exemplary diagram showing a common range of settings associated with four different ranks. For example, settings 200 may correspond to satisfactory settings associated with a first rank, settings 202 may correspond to satisfactory settings associated with a second rank, settings 204 may correspond to satisfactory settings associated with a third rank, and settings 206 may correspond to satisfactory settings associated with a fourth rank.

The different settings may have an overlapping (or intersecting) range of settings, as indicated by region 208 in FIG. 15B. The settings as defined within region 208 may represent a subset of passing settings for all the memory ranks. An optimum setting 210 may then be computed by selecting a setting corresponding to the center of intersecting region 208.

Figure 16:
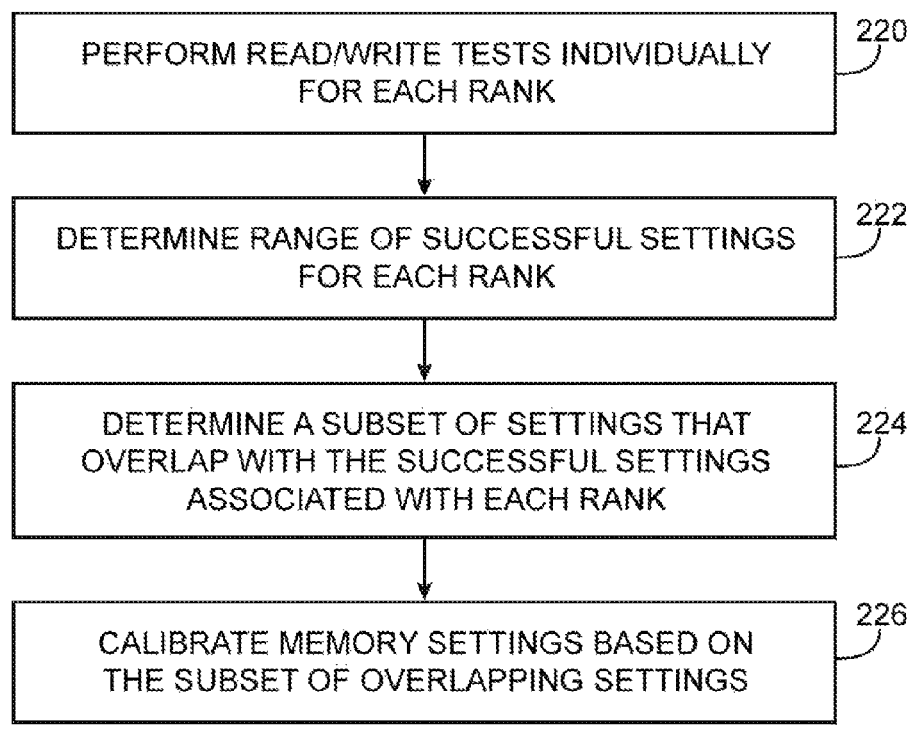
FIG. 16 is a flow chart of illustrative steps for calibrating multi-rank memory in accordance with an embodiment of the present invention.

FIG. 16 is a flow chart of illustrative steps for calibrating multi-rank memory. At step 220, read/write tests may be performed individually for each rank. At step 222, a range of satisfactory settings may be determined for each rank. At step 224, a subset of settings that overlap with the satisfactory settings associated with each rank may be identified. At step 226, an optimum memory setting may be computed by selecting a desired setting from the subset of intersecting settings. The steps of FIG. 16 may be performed using memory interface calibration circuitry 30 (FIG. 2). Memory interface circuitry 24 may then be configured by circuitry 30 to operate using the selected setting when communicating with the different memory ranks.

The calibration techniques described herein may be performed following device startup or during operation of device 10, if desired. For example, operation of device 10 may be periodically halted to allow for recalibration throughout the lifetime of the memory system.

The foregoing is merely illustrative of the principles of this invention and various modifications can be made by those skilled in the art without departing from the scope and spirit of the invention. The foregoing embodiments may be implemented individually or in any combination.

What is claimed is:

1. A method for calibrating memory interface circuitry, the method comprising:

identifying a rising edge timing characteristic associated with a rising edge of at least one signal using the memory interface circuitry;

identifying a falling edge timing characteristic associated with a falling edge of the at least one signal using the memory interface circuitry; and in response to identifying the rising edge and falling edge timing characteristics, reducing differences in timing windows associated with the rising and the falling edges of the at least one signal by independently delaying at least one of the rising and falling edges of the at least one signal using the memory interface circuitry.

2. The method defined in claim 1, wherein the at least one signal comprises a memory data strobe signal, and wherein identifying the rising edge timing characteristic comprises:

with the memory interface circuitry, identifying a first set of delay settings for configuring the memory interface circuitry, wherein the configuring is operable to shift the memory data strobe signal relative to at least one of a corresponding system memory clock rising edge and a first data signal window while satisfying memory timing constraints.

3. The method defined in claim 2, wherein identifying the falling edge timing characteristic comprises:

with the memory interface circuitry, identifying a second set of delay settings for configuring the memory interface circuitry, wherein the configuring is operable to shift the memory data strobe signal relative to at least one of a corresponding system memory clock falling edge and a second data signal window while satisfying the memory timing constraints.

4. The method defined in claim 3, wherein independently delaying the at least one of the rising and falling edges of the at least one signal comprises:

with the memory interface circuitry, determining whether either of the rising and falling edges of the memory data strobe signal is to be adjusted by comparing the first and second sets of delay settings.

5. The method defined in claim 1, wherein the at least one signal comprises a memory data generation clock, wherein the memory data generation clock is operable to generate a stream of data signals during memory read and write operations, and wherein identifying the rising and falling edge timing characteristics comprises:

monitoring the stream of data signals generated in response to the rising edge of the memory data generation clock using the memory interface circuitry; and monitoring the stream of data signals generated in response to the falling edge of the memory data generation clock using the memory interface circuitry.

6. The method defined in claim 5, wherein the memory interface circuitry comprises an adjustable edge delay circuit, and wherein independently delaying the at least one of the rising and falling edges of the at least one signal comprises:

with the adjustable edge delay circuit, reducing duty cycle distortion in the memory data generation clock by independently delaying the at least one of the rising and falling edges of the memory data generation clock.

7. The method defined in claim 1, wherein the at least one signal comprises a memory data signal, and wherein identifying the rising edge timing characteristic comprises:

identifying a first hold time associated with a first memory data bit prior to a rising edge of the memory data signal by delaying a corresponding data strobe signal relative to the memory data signal using the memory interface circuitry.

8. The method defined in claim 7, wherein identifying the falling edge timing characteristic comprises:

identifying a second hold time associated with a second memory data bit prior to a falling edge of the memory data signal by delaying a corresponding data strobe signal relative to the memory data signal using the memory interface circuitry.

9. The method defined in claim 1, wherein the at least one signal comprises a memory data signal, and wherein identifying the rising edge timing characteristic comprises:

identifying a first setup time associated with a first memory bit following a rising edge of the memory data signal by delaying the memory data signal relative to the data strobe signal using the memory interface circuitry.

10. The method defined in claim 9, wherein the at least one signal comprises a memory data signal, and wherein identifying the rising edge timing characteristic comprises:

identifying a second setup time associated with a second memory data bit following a falling edge of the memory data signal by delaying the memory data signal relative to the data strobe signal using the memory interface circuitry.

11. The method defined in claim 8, wherein independently delaying the at least one of the rising and falling edges of the at least one signal comprises:

with the memory interface circuitry, determining whether either of the rising and falling edges of the at least one signal is to be adjusted by comparing the first and second hold times.

12. The method defined in claim 10, wherein independently delaying the at least one of the rising and falling edges of the at least one signal comprises:

with the memory interface circuitry, determining whether either of the rising and falling edges of the at least one signal is to be adjusted by comparing the first and second setup times.

* * * * *